United States Patent
Perez et al.

(10) Patent No.: US 7,029,310 B1
(45) Date of Patent: Apr. 18, 2006

(54) PROTECTIVE COVER PLATE AND ASSOCIATED SYSTEM AND METHOD OF USE

(75) Inventors: Juan M. Perez, Tomball, TX (US); Stephen J. Higham, Houston, TX (US); Michael R. Durham, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/010,605

(22) Filed: Dec. 13, 2004

(51) Int. Cl.
*H01R 13/62* (2006.01)

(52) U.S. Cl. ......................................... 439/331; 439/73

(58) Field of Classification Search ................ 439/331, 439/70, 71, 72, 73, 330, 525, 526, 487, 135
See application file for complete search history.

(56) References Cited

U.S. PATENT DOCUMENTS

| | | | | |
|---|---|---|---|---|
| 5,326,271 | A * | 7/1994 | Kishi et al. | 439/72 |
| 5,657,081 | A * | 8/1997 | Kurahashi | 348/231.7 |
| 6,716,049 | B1 * | 4/2004 | Gattuso et al. | 439/331 |
| 6,741,089 | B1 * | 5/2004 | Conroy | 324/755 |
| 6,805,563 | B1 * | 10/2004 | Ohashi | 439/73 |
| 2004/0266245 | A1 * | 12/2004 | Liao | 439/331 |
| 2005/0064753 | A1 * | 3/2005 | Ma | 439/331 |

* cited by examiner

*Primary Examiner*—Hien Vu

(57) ABSTRACT

In one embodiment there is disclosed a protective cover for a multi-pin electrical device socket. The socket, prior to having a device inserted therein, is covered with a cover having an inner surface facing the socket, a portion of the periphery of the inner surface of the cover contacting a frame having an open area surrounded by the frame structure. The inner surface of the cover has at least one protrusion thereon, with the protrusion adapted to contact an inserted electrical device thereby causing the cover to cease contacting at least one portion of the frame when the electrical device is installed in the socket.

23 Claims, 3 Drawing Sheets

PROTECTIVE COVER PLATE AND ASSOCIATED SYSTEM AND METHOD OF USE

BACKGROUND

The assembly process for installing certain Land Grid Array type processors in a socket requires that a protective cover be removed from the socket after placement of the processor in the socket. The cover is used to protect the delicate connection pins on the socket and also serves as a place to grab for the manufacturing machines. Forgetting to remove the plastic cover and installing a heat sink directly on top of the cover leads to thermal shut down of the system and damage to the ports.

SUMMARY

In one embodiment there is disclosed a protective cover for a multi-pin electrical device socket. The socket, prior to having a device inserted therein, is covered with a cover having an inner surface facing the socket, a portion of the periphery of the inner surface of the cover contacting a frame having an open area surrounded by the frame structure. The inner surface of the cover has at least one protrusion thereon, with the protrusion adapted to contact an inserted electrical device thereby causing the cover to cease contacting at least one portion of the frame when the electrical device is installed in the socket.

BRIEF DESCRIPTION OF THE DRAWINGS

FIG. 1b shows a side view of the socket of FIG. 1a;

FIGS. 2a and 2b show a typical prior art protective cover for the socket of FIG. 1a;

DETAILED DESCRIPTION

Figure 1A:
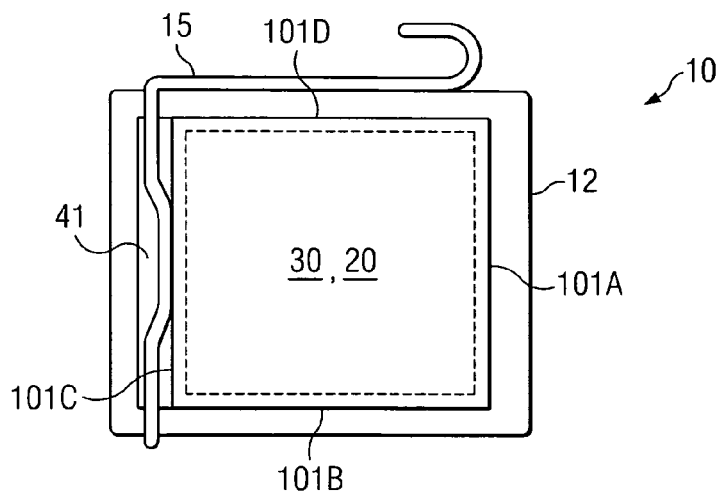
FIG. 1a shows a top plan view of an embodiment showing an empty closed multi-pin socket.
Figure 1B:
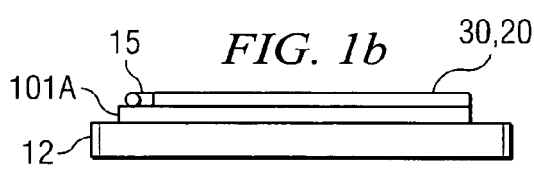

FIGS. 1a and 1b show a top plan view and side view, respectively, of an embodiment of a multi-pin socket, such as land grid array socket 12 without an electrical device mated therewith. Locking lever 15 (shown in the locked position) holds down frame 101A–101D, which frame defines an open area across which protective cover 30 (20) is stretched. Protective cover 30 is held by its periphery to frame elements 101A–101D and, in one embodiment, is sealed to keep debris from the pins (shown in FIG. 4) of socket 12. Typically, the protective cover would have dimensions of 44.0 mm width, length 48.00 mm and thickness 1.0 mm and is manufactured of acrylonitrile-butadiene-styrene terpolymer thermoplastic. The dimensions of the protective cover will depend upon the size and shape of the frame and socket with which it is used. Any number of other appropriate materials may also be used for the cover.

Figure 2A:
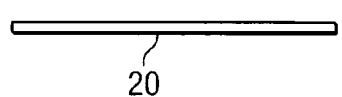

FIG. 2a shows a side view of prior art protective cover 20 which is flat on both its top and bottom surfaces. Thus, when the socket device is closed over the top of an inserted electrical device, such as processor 51 (shown in FIG. 5) protected cover 20 remains in place essentially covering device 51. Thus, if one were to forget to remove protective cover 20 and attach an auxiliary device, such as a heat sink, (shown in FIG. 6) to the top of device 51, the system would fail because the protective cover would be interposed between the two devices. Causing thermal failure.

Figure 2B:
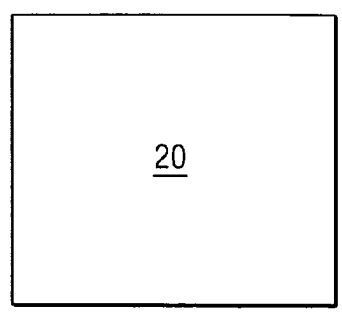

FIGS. 2a and 2b show the side view and bottom view, respectively, of prior art protective cover 20.

Figure 3A:
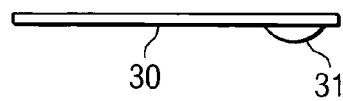
FIGS. 3a and 3b show one embodiment of an improved protective cover.

FIG. 3a shows the side view of a modified protective cover 30 having tabs, such as semi-circular cams 31, protruding downward from the bottom surface of the cover. In one embodiment, these protrusions are approximately 1.3 mm in height. Thus, as will be seen from FIGS. 4, 5, and 6 when the frame that holds the protective cover is lowered over an inserted electrical device, the tabs (protrusions) project into the socket cavity thereby coming into contact with the device inserted in the socket. Tabs 31 can have any shape or size to cause an interfering fit between the cover and a device positioned in the socket may be used. This contact then serves to dislodge protective cover 30 from frame portion 101A indicating to an operator that the remainder of the protective cover must be removed.

Figure 3B:
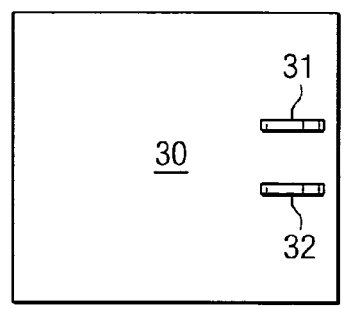

FIG. 3b shows the bottom view of protective cover 30.

Figure 4:
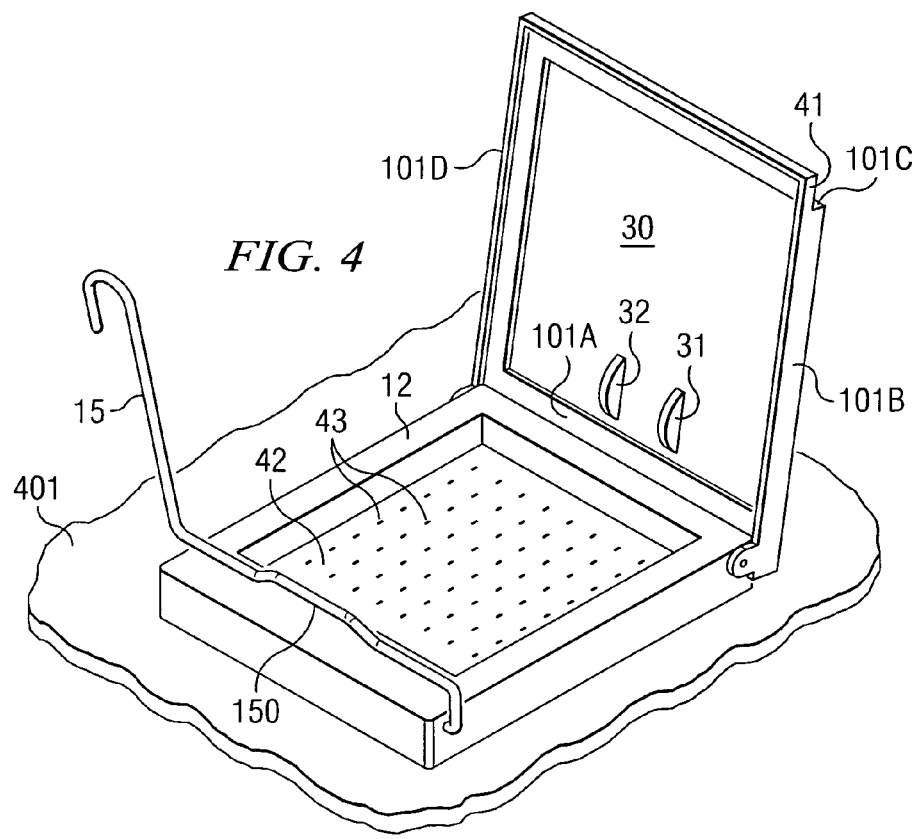
FIG. 4 shows the empty multi-pin socket of FIG. 1 in the open position.

FIG. 4 shows an empty (no electrical device plugged into socket base 42) socket 12 in the 'open' position. Note that locking lever 15 is shown in the open position. When socket 12 is closed, cam 150 of lever 15 would engage lip 41 to hold frame 101A–101D closed thereby maintaining an inserted electrical device in position. Tabs 31, 32 protrude from the bottom surface of cover 30 in a manner such that they do not contact socket base 42 or protruding pins 43 when cover 30 is in a closed position over the socket and no electrical device is present.

Figure 5:
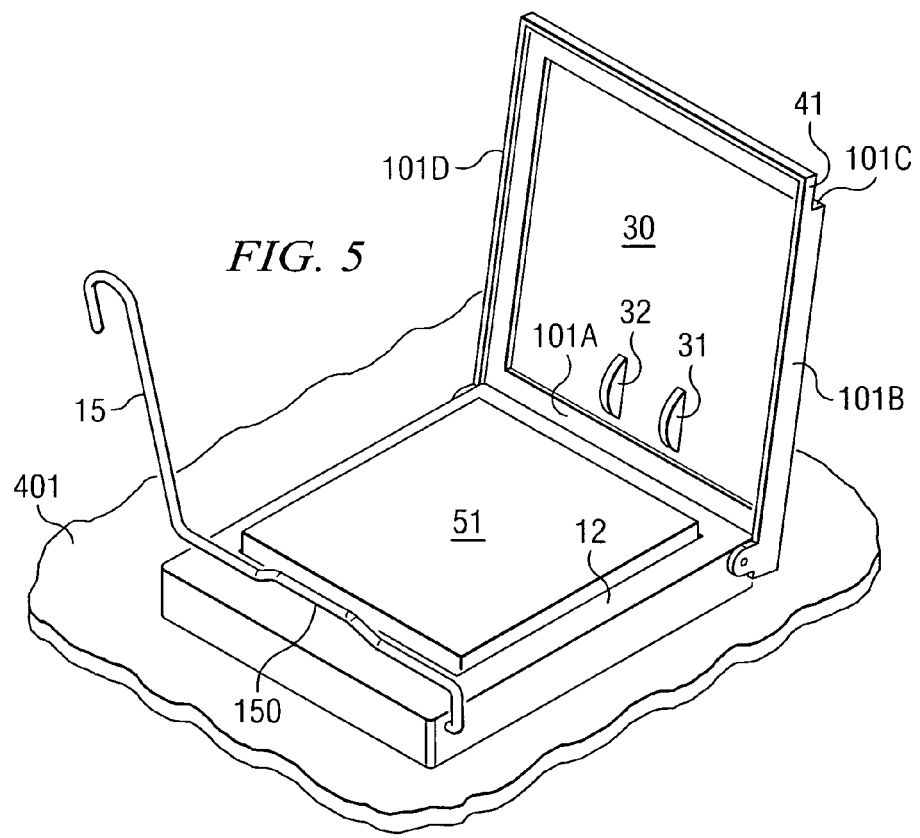
FIG. 5 shows the multi-pin socket of FIG. 4 in the open position after insertion of an electrical device.

FIG. 5 shows electrical device 51, which in this embodiment is a 775 pin land grid array device, inserted in contact with pins 43 of socket base 42 (shown in FIG. 4). Once device 51 is inserted into the socket, frame 101A–101D portion of socket 12 is then closed around device 51 and lever 15 is rotated to hold the frame closed thereby holding device 51 in place.

Figure 6:
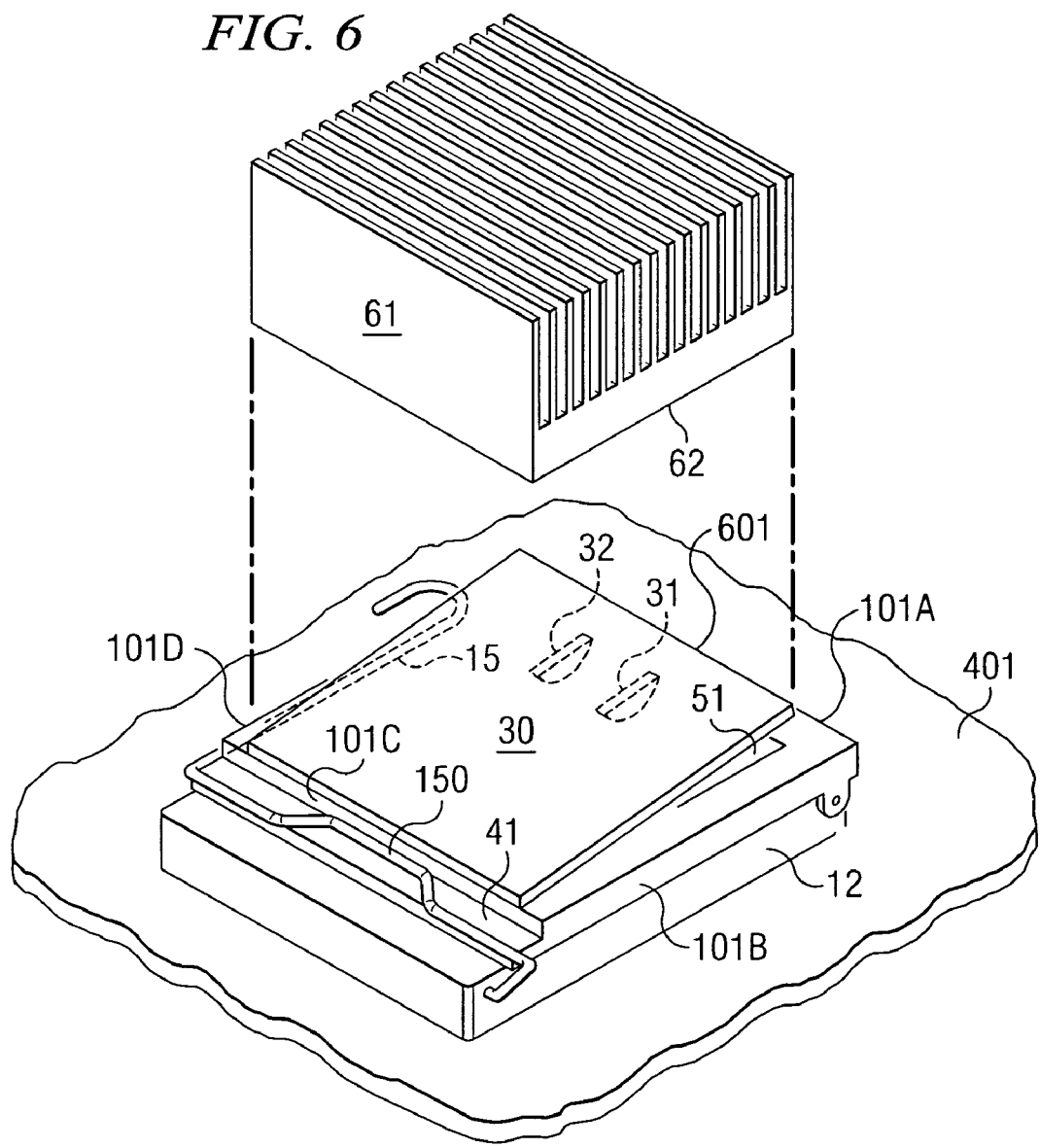
FIG. 6 shows the multi-pin socket of FIG. 5 in the closed position with the protective cover raised.

FIG. 6 shows device 51 mounted within closed socket 12 with lever 15 in the locked position such that cam 150 is rotated over lip 41 of frame 101C. Protrusions 31, 32 on the inside surface of protective cover 30 bear upon the top of device 51 thereby forcing edge 601 of protective cover upward as shown. The operator can now easily remove the protective cover and, if desired, attach heat sink 61 to the top surface of device 51 via the open area within frame 101A–101D. The bottom peripheral dimension 62 of heat sink 61 is such that if fits within the open area formed by frame portions 101A–101D.

Note that the protective cover can be solid or flexible and can have one or more protrusions as desired. Thus, the cover could be designed with protrusions around its periphery so that when the socket is closed all sides of the cover are forced away from frames 101A–101D. Cover 30 may be attached to frame 101A–101D in a manner that permits detachment when tabs 31, 32 engage the top of device 51. Various ways of attaching cover 30 to frame 101A–101D include, but are not limited to end pins, hinges, rotation bars, flexible webbing, one-piece flexible plastic, etc.

What is claimed is:

1. A protective cover system for a multi-pin socket, said protective cover system comprising:

a protective cover for positioning over said multi-pin socket, wherein said socket comprises a base portion for mating with contacts of said electrical device, when an electrical device is not installed in said socket, said protective cover having a bottom surface facing said socket, a portion of the periphery of said bottom surface of said protective cover contacting a frame circumscribing an open area above said multi-pin socket; and said bottom surface having at least one protrusion proximate to an edge thereof, said protrusion adapted to contact an electrical device when said electrical device is installed in said socket and locked in place by said frame thereby causing said protective cover to cease contacting at least one portion of said frame when said electrical device is installed in said socket.

2. The protective cover system of claim 1 wherein said frame is positioned over said base socket when an electrical device is not mated with said contacts, said protective cover mounted across said open area so as to protect said base socket; said frame fitting around an electrical device installed in said socket.

3. The protective cover system of claim 2 wherein said socket further comprises:
at least one locking mechanism for engaging at least one portion of said frame so as to maintain said frame in a closed position.

4. The protective cover system of claim 1 further comprising:
a heat sink mounted to a top surface of said electrical device installed in said socket after removal of said protective cover.

5. The protective cover system of claim 1 wherein said electrical device is a 775 pin land grid array device.

6. A method for inserting a land grid array in a mating socket; said method comprising:
opening a locking device, said locking device constructed to surround said socket with rigid members, said rigid members defining an open area surrounding said socket, said open area having a cover thereacross to protect said socket, said cover having a bottom surface with at least one protrusion thereon, said open area, when said cover has been removed, allowing a top surface of a mated land grid array to be accessed while said locking device holds said land grid array in position,
positioning a land grid array in said socket; and
closing said open locking device such that said rigid members hold said land grid array in said socket, said closing of said locking device causing said cover to open, wherein said opening of said cover comprises lifting one edge of said cover so said cover can be removed from said rigid members.

7. The method of claim 6 further comprising the steps of:
using said lifted edge to remove said cover, and
placing a second device in mated relationship with said positioned land grid array using the area vacated by said removed cover.

8. The method of claim 7 wherein said device is a heat sink affixed to the top of said land grid array.

9. The method of claim 6 wherein said land grid array is a 775 pin device.

10. A system for mating an electrical device in a socket contained on a substrate; said system comprising:
a flat cover having parallel top and bottom surfaces;
a locking device constructed to surround said socket with rigid members, said rigid members defining an open area over said socket, said open area slightly smaller than the area of said flat cover such that said flat cover can be positioned over said defined open area with said bottom surface facing said socket and suspended above said socket so as to protect said socket when an electrical device is not mated in said socket, said rigid members adapted to surround an electrical device when said electrical device is mated with said socket, and
said bottom surface of said cover having protrusions fashioned and positioned proximate to one edge thereon such that when said electrical device is mated with said socket and said locking device is in the locked position said protrusions impact the top surface of said mated electrical device causing said cover to open.

11. The system of claim 10 wherein said flat cover is plastic.

12. The system of claim 10 wherein said flat cover is 1.0 mm thick.

13. The system of claim 10 wherein said protrusions are approximately 1.3 mm in height.

14. The system of claim 10 wherein said protrusions are semicircular.

15. The system of claim 10 further comprising:
a heat sink mated to said top surface of said electrical device after said electrical device has been mated with said socket and locked in positioned by said locking device, said heat sink being positioned in place of said flat cover.

16. A protective cover for a land grid array socket, said protective cover comprising:
a thin structure having a peripheral dimension slightly larger than an open dimension defined by a locking frame of a land grid socket, said peripheral dimension such that said thin structure is held at all points by said peripheral dimension allowing said thin structure to span said open dimension and cover said land grid array socket; and
at least one protrusion proximate to an edge on an inner surface of said thin structure, said protrusion being such that when an electrical device is mated with said land grid array socket and said locking frame is positioned to secure said mated electrical device in said land grid array socket, at least one of said protrusions impact at least one surface of said electrical device causing said thin structure to open.

17. The protective cover of claim 16 wherein said thin structure is flexible.

18. The protective cover of claim 16 wherein said thin structure has a thickness of 1.0 mm.

19. A protective cover device, said protective cover device comprising:
means for securing an electrical device within a defined area;
means for covering said defined area when said electrical device is not within said defined area, wherein said covering means comprises means for allowing said covering means to rotate from an open position in which said covering means does not touch said frame to a closed position in which a bottom surface of said covering means touches said frame; and
means for preventing said covering means from covering said defined area when said device is secured within said defined area, wherein said preventing means is at least partially attached to said bottom surface proximate to an edge of said covering means.

20. The protective cover device of claim 19 wherein said securing means, said covering means and said preventing means are elements of a single structure.

21. The protective cover device of claim 19 wherein said securing means comprises:

a frame for defining said defined area, and
a multi-pin socket contained within said frame.

22. The protective cover device of claim 21 further comprising:
   means for maintaining said covering means in a closed position.

23. The protective cover device of claim 21 wherein said preventing means prevents said covering means from completely covering said defined area when said device is secured within said defined area.

* * * * *